United States Patent [19]
Kagiyama et al.

[11] Patent Number: 4,788,043
[45] Date of Patent: Nov. 29, 1988

[54] PROCESS FOR WASHING SEMICONDUCTOR SUBSTRATE WITH ORGANIC SOLVENT

[75] Inventors: Yasuhiro Kagiyama, Tokuyama; Koichi Doi, Tabuse; Toru Nonaka, Tokuyama; Yuji Ishiyama, Shin-Nanyo; Shigeo Komatsubara, Yokohama, all of Japan

[73] Assignee: Tokuyama Soda Kabushiki Kaisha, Yamaguchi, Japan

[21] Appl. No.: 853,139

[22] Filed: Apr. 17, 1986

[30] Foreign Application Priority Data

Apr. 17, 1985 [JP] Japan .................................. 60-80335
Dec. 4, 1985 [JP] Japan .................................. 60-271365

[51] Int. Cl.$^4$ .......................... B01J 8/00; B01D 13/00
[52] U.S. Cl. ..................................... 422/292; 134/11; 134/12; 134/109; 210/500.27
[58] Field of Search ............. 23/293 R; 156/612, 642; 260/701, 704; 134/10, 12, 11, 103, 104, 109, 186; 34/9; 423/658.5; 210/500.21, 500.27, 634, 637, 638, 640, 642; 422/292, 298, 301

[56] References Cited

U.S. PATENT DOCUMENTS

| | | | |
|---|---|---|---|
| 2,953,502 | 9/1960 | Binning et al. | 210/640 |
| 2,981,680 | 4/1961 | Binning | 210/640 |
| 3,035,060 | 5/1962 | Binning et al. | 260/704 |
| 3,923,541 | 12/1975 | Healy | 131/11 |
| 4,067,805 | 1/1978 | Chiang et al. | 210/640 |
| 4,322,251 | 3/1982 | Elliott | 134/11 |
| 4,615,768 | 10/1986 | McCord | 134/12 |
| 4,643,774 | 2/1987 | Kishida et al. | 134/1 |

FOREIGN PATENT DOCUMENTS

| | | | |
|---|---|---|---|
| 0050247 | 4/1982 | European Pat. Off. | 134/11 |
| 2098576 | 3/1972 | France | 134/11 |

OTHER PUBLICATIONS

Colclaser, R., "Microelectronics: Processing and Device Design", Wiley & Sons, 1980, p. 82.
Himmelblau, D., "Basic Principles and Calculations in Chemical Engineering", Prentice-Hall, 4th Ed., 1982, pp. 154–155.
Vossen et al., "Thin Film Processes", Academic Press, 1978, p. 413.

*Primary Examiner*—John Doll
*Assistant Examiner*—R. Bruce Breneman
*Attorney, Agent, or Firm*—Sherman and Shalloway

[57] ABSTRACT

Disclosed is a process for washing a semiconductor substrate with an organic solvent, which comprises the first stage of supplying an organic solvent to be used for the organic solvent washing of a semiconductor substrate to a washing device and washing the semiconductor substrate, the second stage of supplying the organic solvent containing water, electrolytes and particulate or clustery suspended substances, which has been withdrawn from the first stage, to a pervaporation device and separating and removing mainly water, and the third stage of supplying the organic solvent withdrawn from the second stage to a distillation device to obtain the organic solvent as a distillate and recycling the distillate as the organic solvent to the first stage, the three stages being combined to form a continuous circulation systems.

8 Claims, 1 Drawing Sheet

PROCESS FOR WASHING SEMICONDUCTOR SUBSTRATE WITH ORGANIC SOLVENT

BACKGROUND OF THE INVENTION

(1) Field of the Invention

The present invention relates to a process for washing an electronic material such as a silicon wafer, especially a semiconductor substrate, with an organic solvent. More specifically, the present invention relates to a process for circulating an organic solvent in order to reuse it to make use of the organic solvent washing.

(2) Description of the Prior Art

When a semiconductor substrate is processed into an intended part of an electronic appliance, the semiconductor substrate is subjected to mechanical treatments such as cutting and grinding and chemical treatments such as chemical etching with an acid or the like. Cut chips, grounds, electrolytes such as acids and clusters of oily substances adhere to the processed substrate, and these adhering substances are removed by water washing. But even if ultra-pure water is used for this water washing, impurities such as the electrolyte fine particles of solid or clustery suspended oils (collectively referred to as "particles" hereinafter) and a high-boiling-point substance are contained in water drops adhering to the substrate after water washing, and if water is removed only by evaporation and drying, stains called "water marks" are formed on the semiconductor substrate and defective products are prepared.

Accordingly, after water washing, water and impurities contained in water must be removed by washing with an organic solvent, especially an organic solvent having a good compatibility with water. This operation is called "organic solvent washing" in the instant specification. As the solvent ordinarily used for the organic solvent washing, there can be mentioned alcohols such as ethanol, n-propanol, isopropanol, isobutanol and isopentanol, halogenated hydrocarbons such as methyl chloride, methylene chloride, carbon tetrachloride, trichloroethane, trifluoro-ethanol and perchloroethylene, ethers such as diisopropyl ether and ethylisobutyl ether, hydrocarbons such as hexane, cyclohexane and benzene, and esters such as isobutyl formate, propyl acetate and methyl propionate. An alcohol, especially isopropanol (hereinafter referred to as "IPA"), is popularly used.

If the same solvent is used repeatedly for the organic solvent washing, impurities such as water, electrolytes and particles are naturally accumulated in the solvent and the amounts of these impurities are increased. When the water concentration in the organic solvent used for the organic solvent washing is thus changed, the quality or yield of the semiconductor substrate is delicately affected by the water content, and hence, it is important to maintain the quality of the organic solvent per se stable. As means for attaining this object, there may be considered a method in which the organic solvent is frequently exchanged with fresh one. However, this method is defective in that the economical loss is large. Moreover, when the organic solvent is exchanged, impurities such as particles are incorporated into the organic solvent from a vessel or the circumference and then the fresh organic solvent is frequently contaminated.

Accordingly, in view of the stabilization of the quality and from the economical viewpoint, it is preferred that the once-used organic solvent containing various impurities (hereinafter referred to as "waste organic solvent") be purified and reused repeatedly.

However, the method in which the waste organic solvent is purified involves several problems. As is apparent from the intended use of the organic solvent, it is necessary that the organic solvent used for the organic solvent washing should have a certain water-dissolving power, preferably a water-dissolving power of at least 10% by weight, and the organic solvent has a large polarity and forms an azeotropic mixture with water. For example, isopropanol forms an azeotropic mixture with water at a concentration of about 88% by weight (the water concentration is 12% by weight). It is therefore impossible to concentrate an aqueous solution of IPA having a lower concentration beyond the concentration of 88% by weight by an ordinary distillation operation. There can be mentioned a method in which an entrainer such as benzene is added to an aqueous solution of IPA and azeotropic distillation is carried out. However, in carrying out this method, there should be arranged at least three columns, that is, the column for dehydration with the entrainer, the column for removing water recovered by the entrainer and the column for purification of IPA. And also in order to increase the organic solvent concentration to a level adopted for the organic solvent washing, that is, at least 99% by weight, preferably at least 99.5% by weight, a rectification column having at least 100 stages becomes necessary. This corresponds to a column height exceeding 6 m.

As the method for purifying the waste organic solvent which is in the solvent-rich state where the concentration of water incorporated by the organic solvent washing does not reach the azeotropic level, in case of, for example, IPA, there may be considered a method in which by utilizing the azeotropic distillation, water is removed in the form of an IPA-water azeotropic mixture from the head of the azeotropic distillation dehydration column and IPA having a reduced water content is recovered from the column bottom. According to this method, however, a rectification column having about 80 stages is necessary, and an azeotropic distillation dehydration column having a height of at least about 5 m is necessary. Furthermore, the loss ratio of IPA is ordinarily higher than 20%, and it is considered that this method cannot be put into practical use. Of course, if IPA is withdrawn from the column bottom, particles or electrolytes cannot be removed. Accordingly, after removal of the initial fraction having the azeotropic composition, distillation of IPA should be carried out, and since the purified solvent cannot be taken out while the initial fraction is being removed, continuous circulation is impossible.

There may also be considered a method in which a drier such as a molecular sieve is used as means for dehydrating the organic solvent. However, this method is not suitable for drying an organic solvent containing water in such a large amount as exceeding 10% by weight, and there is a risk of new incorporation of particles through the molecular sieve. Therefore, this method is not substantially preferred.

Under this background, it has been eagerly desired to develop a process for washing a semiconductor substrate with an organic solvent, which is provided with a purification system in which the waste organic solvent is effectively purified in a chamber such as a clean room with a reduced loss ratio without a risk of incorporation of impurities.

SUMMARY OF THE INVENTION

It is therefore a primary object of the present invention to meet the above-mentioned desire and provide a system for purification, circulation and re-utilization of an organic solvent in the organic solvent washing, which has a compact structure and has such a small size that the system can be arranged in a clean room in which a semiconductor substrate is processed.

More specifically, in accordance with the present invention, there is provided a process for washing a semiconductor substrate with an organic solvent, which comprises the first stage of supplying an organic solvent to be used for the organic solvent washing of a semiconductor substrate to a washing device and washing the semiconductor substrate, the second stage of supplying the organic solvent containing impurities such as water, electrolytes and particulate or clustery suspended substances, which has been withdrawn from the first stage, to a pervaporation device and separating and removing mainly water, and the third stage of supplying the organic solvent withdrawn from the second stage to a distillation device to obtain the organic solvent as a distillate and recycling the distillate as the organic solvent to the first stage, the three stages being combined to form a continuous circulation system.

As the purification system comprising a pervaporation device and a distillation device, Japanese patent application Laid-Open Specification No. 33279/79 discloses a process for concentrating a low-concentration alcohol produced by the biomass, in which the majority of water is removed by the pervaporation device, the remainder of water is removed in the form of an azeotropic alcohol-water mixture from the distillation column and the dehydrated alcohol is recovered from the column bottom. Furthermore, Hideaki Asai reported the simulation of distilling a water-ethanol solution and concentrating the distillate to 99.5% by weight by pervaporation and the calculated value of the necessary quantity of heat at the 48th annual meeting of the Society of Chemical Engineers, Japan (1983).

In each of these methods, the concentration is carried out while avoiding the azeotropic point of a water-alcohol solution. In the former method, since the concentrated alcohol is recovered from the bottom of the distillation column, if the method is used for purification of the waste organic solvent coming from the step of the organic solvent washing of a semiconductor substrate as in the present invention, removal of particles is impossible. Therefore, the method cannot be applied to the present invention.

It is expected that sufficient purification will be possible according to the latter method. However, from our experiences, it has been confirmed that particles cannot be sufficiently removed and the method is not suitable for the organic solvent washing of a semiconductor substrate. When research was made to clarify the reason of this disadvantage, it was found to our great surprise that minute amounts of various organic substances are dissolved out into the organic solvent from a separating membrane used for the pervaporation. Accordingly, in the present invention, it is indispensable that distillation is carried out after the pervaporation step and the organic solvent should be recovered as the distillate.

The present invention will now be described in detail.

DETAILED DESCRIPTION OF THE PREFERRED EMBODIMENTS

Figure 1:
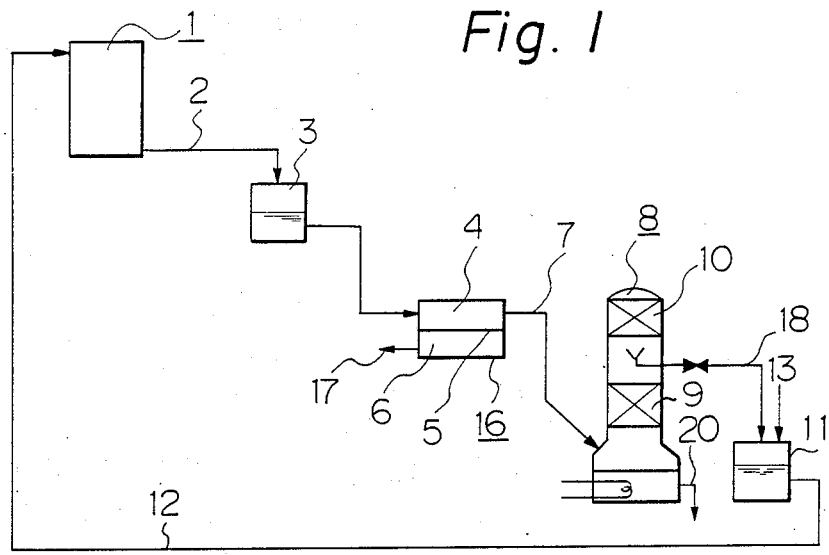
FIG. 1 is a diagram illustrating a typical embodiment of the present invention.

As pointed out hereinbefore, the present invention provides a novel purification and circulation system for a solvent to be supplied to the step of the organic solvent washing of a semiconductor substrate. Accordingly, the organic solvent washing of the first stage is not particularly critical, and known methods customarily adopted, such as an organic solvent vapor washing method, an organic solvent shower washing method, a spray washing method and a dipping method may be adopted.

The waste organic solvent to be purified in the present invention is an organic solvent containing water, an acid, other electrolyte and particles. When the water content in the waste organic solvent is in the range of 10 to 40% by weight, preferably 10 to 20% by weight, especially preferably 10 to 15% by weight, the waste organic solvent is guided to the purification step of the second stage. In the waste organic solvent having a water content below the above-mentioned range, the reduction of the washing effect by the presence of water is small and the impurity-free organic solvent can be obtained relatively easily by the distillation described hereinafter. If the water content exceeds the above-mentioned range, the washing effect of the organic solvent is substantially lost and uneconomical. The majority of water contained in the waste organic solvent withdrawn from the first stage is removed by the pervaporation at the second stage. The water content in the organic solvent is ordinarily reduced below 3% by weight, preferably below 1% by weight, especially preferably below 0.5% by weight. The pervaporation method is not particularly critical. The principle of the pervaporation method is disclosed, for example, in J. Memb. Sci., 7, 109–118 (1980), J. Memb. Sci., 8, 105–114 (1981) and J. Memb. Sci., 9, 191–196 (1981). Namely, according to the pervaporation method, a mixture comprising at least two volatile liquids is supplied to one side of a separating membrane and the liquid permeating the membrane is gasified on the other side of the membrane. Known membranes showing a selective water permeability in an organic solvent-water system can be used as the separating membrane without any particular limitation, but a separating membrane having a solution permeation coefficient of at least 0.01 kg/m$^2$ hr, especially at least 0.05 kg/m$^2$ hr, and a separation coefficient of at least 10, especially at least 30, is preferably used. Incidentally, the separation coefficient is represented by the following formula:

$$\text{Separation coefficient} = \frac{A/B}{C/D}$$

wherein A stands for the water concentration in the permeating liquid, B stands for the solvent concentration in the permeating liquid, C stands for the water concentration in the starting waste liquid and D stands for the solvent concentration in the starting waste liquid.

A known ion-exchange membrane is ordinarily used as the separating membrane. An anion exchange resin membrane containing an anion exchange group such as a pyridinium group, an amine group or a quaternary ammonium group is especially preferred because also the acid component is effectively removed. Furthermore, a cation exchange membrane having a relatively weak acid group such as a carboxylic acid group, a phosphoric acid group or a phenolic hydroxyl group is advantageous in that the stain resistance is high and the membrane can be continuously used for a long time. Needless to say, a cation exchange membrane having a fluorocarbon resin structure and containing at least one of a sulfonic acid group and carboxylic group as the ion exchange group and other separating membranes can be used.

A device comprising in principle a liquid chamber and a permeating vapor chamber, which are partitioned by a separating membrane, is ordinarily used as the pervaporation device. For example, a so-called filter press type device comprising a plurality of liquid chambers and a plurality of permeating liquid vapor chambers, which are alternately arranged through separating membranes is preferably used. Furthermore, a device comprising a hollow yarn or a device comprising a spiral separating membrane may be used. Moreover, a device provided with a heater for supplying gasification heat may be used. It is preferred that the operation be carried out under such conditions that the temperature of the liquid to be treated is 20° to 100° C. and the vacuum degree in the permeating vapor chamber is 0 to 100 Torr, especially 50 Torr.

Even if the pervaporation method is adopted, the organic solvent is transferred to the permeating vapor chamber according to the value of the separation coefficient, resulting in loss of the organic solvent. However, if a separating membrane having a separation coefficient within the above-mentioned range and the water content in the waste organic solvent is reduced, for example, to 0.5 to 1% by weight from 10 to 20% by weight, the loss of the organic solvent is ordinarily lower than 5% by weight.

The organic solvent which is dehydrated and preferably deionized at the second stage is fed to the distillation step of the third stage and the organic solvent is recovered as the distillate.

A distillation device capable of recovering the organic solvent as the distillate may be used at the third stage of the present invention without any particular limitation. An evaporator (simple distillation device) may be used. When the organic solvent to be treated contains suspended substances such as particles and other soluble impurities, in order to prevent the organic solvent from entraining these suspended substances and other impurities in the form of splashes, it is preferred that a demister be arranged in the gas phase portion of the distillation device. Ordinarily, at least one stage of a tray or a filler is disposed. As the tray, there can be mentioned a bubble cap tray, a perforated plate tray and a sieved tray, and as the filler, there can be mentioned a Raschig ring, a bell saddle, an interlocked saddle, a Lessing ring, a ball ring, a net and a woven fabric. In view of the efficiency of the demister and in order to reduce the size of the distillation system, it is preferable to adopt a packed column type system.

A reflux type distillation column disclosed in Japanese patent application No. 123154/83 or Japanese Utility Model Application No. 109008/83 is preferred as the distillation device.

The device used at the third stage of the present invention is not limited to those mentioned above. It is preferred that a distillation device comprising an evaporator zone provided with a heat source and a demister (rectifying zone), in which sufficient care is taken so that impurities such as particles are not newly incorporated in the organic solvent at the distillation operation, should be used. It is especially preferred that the interior of the distillation device and the interiors of connecting pipes be surface-treated by buffing, acid washing or alkali washing so that fine particles should not be formed by the distillation operation. It also is preferred that the distillation device be sealed by a sealing gas such as clear air or nitrogen gas so that the interior of the device is not contaminated by impurities and gases contained in a gas such as environmental air intruded into the device during the stoppage of the operation of the distillation device. In view of the quality control of the treated organic solvent, it is preferred that number of particles having a diameter larger than 0.5 $\mu$m, contained in the using gas, be less than 350 per liter. If a demister having too high a rectifying effect is used, it sometimes happens that water is concentrated in the column head portion and no good results can be obtained.

One means for preventing the distillate from entraining fine particulate impurities is not to increase the distillation speed to too fast, whereby entrainment of splashes is prevented. The linear distillation speed is ordinarily adjusted below 50 cm/sec, preferably to 1 to 20 cm/sec.

The distillate from the above-mentioned third stage is recycled to the first stage directly or after addition of a fresh organic solvent and is used for the organic solvent washing of a semiconductor substrate.

In order to prevent incorporation of impurities into the organic solvent from the outside, it is important that the above-mentioned three stages should be combined to one another to form one circulation system. For this purpose, it is preferred that the connecting pipes be arranged so that the system for the purification of the organic solvent is not exposed to outer air.

The circulation system of the present invention will now be described with reference to the accompanying drawings.

Figure 2:
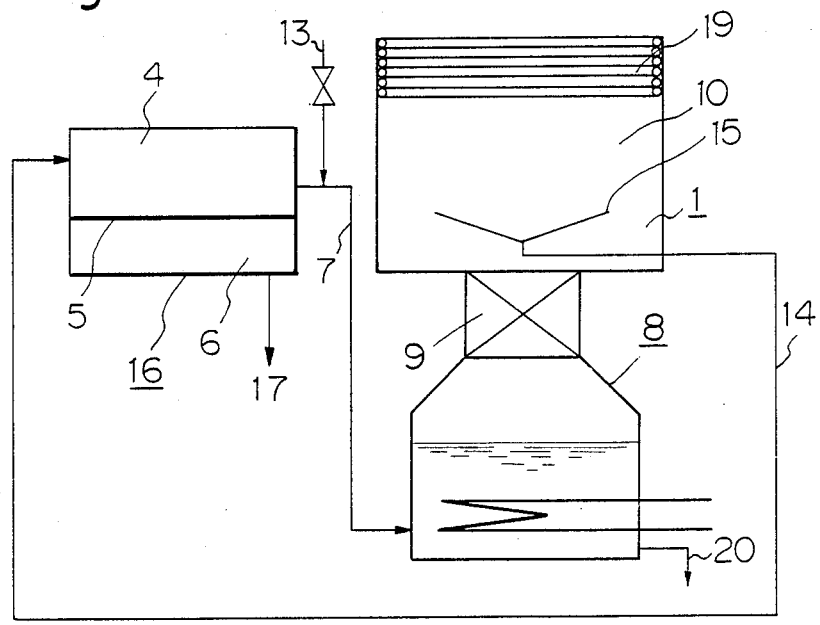
FIG. 2 is a diagram illustrating an embodiment having a compact structure suitable for arrangement in a clean room, in which the first stage is integrated with the third stage.

FIG. 1 is a diagram illustrating a typical embodiment of the present invention. FIG. 2 is a diagram illustrating an embodiment having a compact structure suitable for arrangement in a clean room, in which the first stage is integrated with the third stage.

Referring to FIG. 1, a waste organic solvent used for the organic solvent washing is withdrawn from a washing device 1 as the first stage and introduced into a waste liquid tank 3 through a line 2. The waste organic solvent is supplied to a liquid chamber 4 of a pervaporation device 16 as the second stage from the water liquid tank 3 by means of a pump or the like to remove the majority of water. Reference numeral 5 represents a separating membrane and reference numeral 6 represents a permeating vapor chamber. A gas permeating the separating membrane 5 is discharged from a line 17 directly or after condensation. The dehydrated liquid to be treated is fed to a distillation device 8 as the third stage from a line 7 by utilizing the back pressure or the like. Reference numeral 9 represents a filler and reference numeral 10 represents a condenser. The refined organic solvent, from which impurities such as electrolytes and particles have been removed, is withdrawn as the distillate from the distillation device and is stored in an intermediate tank 11 through a line 18. The organic solvent, from which impurities such as water, electrolytes and particles have been thus removed, is returned to the washing device 1 as the first stage through a circulation line 12 and used again for the organic solvent washing. If necessary, a fresh organic solvent is supplied from a line 13 to compensate the organic solvent lost at the washing or purifying step. Of course, the position for the supply of the fresh organic solvent is not limited to the position shown in the drawings.

If the concentration of particles having a diameter larger than 0.5 μm in the waste organic solvent exceeds a certain level, for example, 100000 particles per 100 ml, preferably 50000 particles per 100 ml, the waste organic solvent is intermittently withdrawn from the bottom of the distillation device through a line 20.

When the above-mentioned circulation system was actually used, if the organic solvent withdrawn from the first stage was, for example, IPA containing 15% by weight of water, about 9500 particles (having a particle size larger than 0.5 μm) per 100 ml and as ionic substances, 6 ppm of Na ions, 5 ppm of K ions, 9 ppm of Fe ions and 8 ppm of Cu ions and having a specific resistance of 2 MΩ-cm and this IPA was dehydrated in the pervaporation device and was subjected to the distillation operation, the obtained IPA distillate had a concentration of 99.7% by weight, contained 930 particles per 100 ml, 0.02 ppm of Na ions, 0.003 ppm of K ions, 0.003 ppm of Fe ions and 0.001 ppm of Cu ions and had a specific resistance of 250 MΩ-cm. Thus, it was confirmed that the number of particles and the concentrations of ionic substances can be greatly reduced by adoption of the above-mentioned circulation system according to the present invention. When commercially available IPA of the grade for washing semiconductors is analyzed, it is found that the IPA concentration is 99.9% by weight, the particle number is 2600 per 100 ml, the Na ion concentration is 0.05 ppm, the K ion concentration is 0.01 ppm, the Fe ion concentration is 0.01 ppm, the Cu ion concentration is 0.01 ppm and the specific resistance is 90 MΩ-cm. Accordingly, the treated liquid which has been subjected to the pervaporation treatment and distillation treatment has a quality comparable to that of a fresh liquid. Therefore, it will be readily understood that the circulation system of the present invention is very effective.

A preferred embodiment of the present invention is illustrated in FIG. 2. This embodiment is structurally characterized in that the organic solvent washing is carried out according to the vapor washing method and an organic solvent vapor-generating chamber (evaporator) of the third stage is integrated with a device of the first stage for the organic solvent washing of a semiconductor substrate, especially a vapor washing device, so that the vapor generated in the vapor-generating chamber of the third stage is introduced to the washing device of the first stage through a demister. More specifically, as shown in FIG. 2, an organic solvent vapor washing device 1 of the first stage is connected to the upper portion of a demister 9 such as a packed layer, and a vapor-generating chamber in a distillation device 8 of the third stage. A vapor washing chamber 10 (having the function of the organic solvent washing device 1 shown in FIG. 1) comprises a condensate-receiving saucer 15. The vapor-generating chamber has an internal heating structure or an outer heating structure provided with a jacket for generating a vapor to be used for the vapor washing. In the vapor washing chamber 10, a semiconductor substrate is washed and dried by the vapor of the organic solvent. A cooler 19 is ordinarily arranged in the upper portion of the vapor washing chamber 10 to prevent diffusion of the vapor of the organic solvent. In the interior of the vapor washing chamber 10, the condensate-receiving saucer 15 is arranged to remove the condensate of the solvent used for the washing and containing water, electrolytes and particles and withdraw the condensate to the outside of the vapor washing chamber 10, whereby accumulation of water and other impurities in the vapor-generating chamber is prevented, and by the action of the demister, for example, packed layer 9 as well as the action of the condensate-receiving saucer 15, the washing can always be accomplished by the vapor generated by evaporation of the high-purity organic solvent. Furthermore, particles entrained by the vapor generated in the vapor-generating chamber impinge against the demister 9, and the demister exerts a function of intercepting the particles and allowing only the organic solvent vapor to pass therethrough. Accordingly, the shape or the like of the demister 9 is not particularly critical, so far as it exerts this function.

The vapor-generating chamber connected to the vapor washing chamber 10 is connected to a liquid chamber 4 of a pervaporation device 16 through a line 14. The organic solvent, from which water and preferably acid components have been removed in the liquid chamber 4 of the pervaporation device 16, is supplied to the vapor-generating chamber through a line 7. A fresh organic solvent may be supplied from a line 13. If the organic solvent supplied from the line 13 contains water or the like, it is preferred that the organic solvent be supplied to a line 14. Since the condensate-receiving saucer 15 arranged in the vapor washing chamber 10 is connected to the liquid chamber 4 of the pervaporation device 16 through the line 14, the organic solvent containing water and particles, which has been used for the washing and is obtained as the condensate, is supplied to the pervaporation device 16 and water is separated from the organic solvent. In order to control accumulation of particles in the circulation system and moderate the load imposed on the demister 9, it is preferred that a filter such as a microfilter composed of a microporous membrane be disposed in the line 7 or 14 to remove the particles.

The present invention will now be described in detail with reference to the following examples that by no means limit the scope of the invention.

EXAMPLE 1

A waste IPA solution discharged from a device for the organic solvent washing of wafers was treated by using a system as shown in FIG. 1. Namely, the waste IPA solution was purified by using a pervaporation device provided with an ion exchange membrane and a distillation device of the packed column type. When the waste IPA solution was sampled and analyzed, it was found that the IPA concentration was 91% by weight, the water content was 9% by weight, the acid concentration (as HF) was 13 ppm, the Na ion concentration was 12 ppm, the K ion concentration was 7 ppm, the Fe ion concentration was 12 ppm, the Cu ion concentration was 13 ppm the specific resistance was 0.3 MΩ-cm and the number of particles (having a particle size larger than 0.5 μm) was 9700 per 100 ml. The waste IPA solution was first fed to the pervaporation device and was subjected to the dehydration treatment. The pervaporation device comprises as the separating membrane a pyridinium type anion exchange membrane having an effective membrane area of 1 m², which had been prepared in the following manner.

A viscous pasty mixture was prepared from 100 parts of 2-methyl-5-vinylpyridine, 10 parts of divinylbenzene (having a purity of 50%), 2 parts of benzoyl peroxide and 50 parts of a fine powder of polyvinyl chloride, and the mixture was coated on a polyvinyl chloride fabric and heat-polymerized to obtain a polymer membrane. This polymer membrane was dipped in a quaternizing solution comprising methyl iodide and methanol at a ratio of 1:1 at room temperature for 16 hours. The membrane was dipped in a liquid mixture comprising water and acetone at a volume ratio of 1:2 for about 20 hours and was then dipped in water to remove acetone. The thickness of the obtained membrane was 120 μm.

The separation characteristics of the pervaporation using this membrane were such that at an IPA concentration of 95% by weight, a liquid temperature of 60° C. and a vacuum degree of 10 Torr, the permeation coefficient was 0.35 kg/m² hr and the separation coefficient was 160. The separation coefficient was expressed by the ratio of the value of (water concentration in permeating liquid)/(IPA concentration in permeating liquid) to the value of (water concentration in starting liquid)/(IPA concentration in starting liquid). An aqueous solution having an IPA concentration of about 22.5% by weight was withdrawn at a rate of 0.16 kg/hr from the vapor permeating chamber side of the pervaporation device, and the loss ratio of IPA was about 2.6%. When the liquid treated in the pervaporation device was sampled at the outlet of the device and analyzed, it was found that the IPA concentration was 99.2% by weight, the water content was 0.8% by weight, the acid content was 1 ppm, the Na ion concentration was 6 ppm, the K ion concentration was 5 ppm, the Fe ion concentration was 9 ppm, the Cu ion concentration was 8 ppm, the specific resistance was 2 MΩ-cm, and the number of particles was 9500 per 100 ml. Thus, it was confirmed that water and the acid component were sufficiently removed. Then, the liquid, from which the majority of water had been removed in the pervaporation device, was continuously supplied to the distillation device connected to the pervaporation device through a pipe, and the liquid was subjected to the treatment for removing the ionic substances and particles. The distillation device was formed of stainless steel and had an inner diameter of 60 mm. A porcelain ⅜ Raschig ring was used as the filler, and the packing height was 100 cm and the total height of the distillation column was 180 cm. The distillation device was operated at a reflux ratio of 1:1 and a distillation speed of 1.34 kg/hr (linear speed is 34.9 cm/sec in the demister). The distillate was introduced in the treated liquid tank. The distillation column and treated liquid tank were sealed by $N_2$ gas filtered through a filter having a pore size of 0.1 μm so that impurities in open air were not introduced. When the distillate (treated liquid) from the distillation device was sampled and analyzed, it was found that the IPA concentration was 99.1% by weight, the water content was 0.9% by weight, the acid content was lower than 1 ppm, the Na ion concentration was 0.02 ppm, the K ion concentration was 0.03 ppm, the Fe ion concentration was 0.03 ppm, the Cu ion concentration was 0.01 ppm, the specific resistance was 250 MΩ-cm, and the number of particles was 930 per 100 ml. Thus, it was confirmed that the ionic substances and particles were sufficiently removed.

Then, the treated purified IPA was recycled to the above-mentioned washing step from the treated liquid tank through a pipe sealed from outer air. The washing could be stably carried out at a high washing effect without incorporation of impurities. Fresh IPA was supplied in an amount corresponding to the amount of lost IPA at the washing step.

Incidentally, in the present and subsequent examples, the IPA and water concentrations were determined according to the gas chromatography, the acid content was determined by the alkali titration, the Na and K ion concentrations were determined according to the atomic absorption spectroscopy, the Fe and Cu ion concentrations were determined according to the ICP method, the specific resistance was measured by a specific resistance meter, and the number of particles was measured by an automatic particle counter.

EXAMPLE 2

The waste IPA was purified in the same manner as described in Example 1 except that a quaternary ammonium salt type anion exchange membrane (NEOSEPTA AM-1, a trademark of Tokuyama Soda) was used as the separating membrane of the pervaporation device. The waste IPA having an IPA concentration of 91% by weight was supplied at 1.1 kg/hr to the pervaporation device and was dehydrated so that the IPA concentration was increased to 99.0% by weight. The $Na^+$, $K^+$, $Fe^{3+}$ and $Cu^{2+}$ concentrations and the number of particles were substantially the same as those of Example 1, but the acid content was 7 ppm. The loss ratio of IPA was 4.6%. The liquid treated in the pervaporation device was treated in the subsequent distillation device in the same manner as described in Example 1 to remove the ionic substances and particles, and the distillate from the distillation device was used for the washing treatment again. The washing could be carried out stably without reduction of the washing effect.

EXAMPLE 3

Silicon wafers for a semiconductor device were subjected to the organic solvent washing by using the apparatus shown in FIG. 2.

Referring to FIG. 2, the waste IPA liquid sampled at the line 14 had an IPA concentration of 85% by weight (the water content being 15% by weight), an Na ion concentration of 1.5 ppm, a K ion concentration of 2 ppm, an Fe ion concentration of 0.8 ppm, a Cu ion concentration of 2 ppm and a specific resistance of 2MΩ-cm, and the number of particles (having a particle size larger than 0.5 μm) was 15000 per 100 ml.

The same separating membrane as used in Example 1, which had an effective membrane area of 2 m², was attached to the pervaporation device 16. The waste IPA was supplied at a rate of 1.5 kg/hr and dehydrated at 70° C. The dehydrated IPA was withdrawn at a rate of 1.25 kg/hr from the line 7. When the liquid was sampled at the line 7 and analyzed, it was found that the IPA concentration was 99.7% by weight. The treated liquid was fed to the distillation device 8 while supplying fresh IPA at a rate of 0.25 kg/hr from the supply line 13. The demister 9 had a diameter of 10 cm and a length of 20 cm and was filled with a Dickson packing. A vapor was generated at a rate of 1.5 kg/hr at the vaporgenerating chamber, and the IPA vapor was supplied to the vapor washing zone 10 while adjusting the linear speed at the demister 9 to 1.98 cm/sec. when this vapor was sampled and analyzed, it was found that the IPA concentration was 99.7% by weight (the water content being 0.3% by weight), the Na ion concentration was 0.05 ppm, the K ion concentration was 0.002 ppm, the Fe concentration was 0.002 ppm, the Cu ion concentration was 0.001 ppm, the number of particles (having a particle size larger than 0.5 μm) was 1250 per 100 ml, and the specific resistance was 900 MΩ-cm.

We claim:

1. A unitary apparatus for conducting organic solvent washing of semiconductor substrates to remove at least water and particulate matter therefrom, said apparatus comprising:

an upper vapor washing zone comprising
a washing space for receivably containing a semiconductor substrate and washing at least water and particulate matter therefrom,
a vapor condensing space, disposed above said washing space and fluidically connected thereto, for condensing an organic solvent vapor,
a collection means, disposed below said washing space and fluidically connected thereto, for receiving said condensed organic solvent vapor containing water and particulate matter;
a lower vapor generating zone comprising a distillation means for generating said organic solvent vapor from an organic solvent containing particulate material, said particulate material being entrainable in said organic solvent vapor;
an intermediate demisting zone, disposed between said upper vapor washing zone and said lower vapor generating zone, for fluidically connecting said upper vapor washing zone and said lower vapor generating zone so as to allow passage of said vapor from said lower vapor generating zone to said upper vapor washing zone and to inhibit passage of said particulate material from said lower vapor generating zone to said upper vapor washing zone;
a pervaporation means for removing water from said organic solvent containing water and particulate matter, said pervaporation means comprising
a liquid treating chamber, receivable of organic solvent containing water and particulate matter,
a permeation vapor chamber, receivable of water, and
a substantially selective water-permeable membrane fluidically connecting said liquid treating chamber and said permeation vapor chamber, wherein water contained in said organic solvent in said liquid treating chamber substantially selectively passes through said membrane to said permeation vapor chamber;
first fluid connection means for fluidically connecting said collection means and said liquid treating chamber to feed condensed organic solvent vapor containing water and particulate matter from said collection means to said liquid treating chamber;
second fluid connection means for fluidically connecting said liquid treating chamber and said lower vapor generating zone to feed organic solvent containing water and particulate matter, from which said water has been substantially removed, from said liquid treating chamber to said lower vapor generating zone;
water-removal means for removing water from said permeation vapor chamber.

2. The unitary apparatus according to claim 1, further comprising means for adding make-up solvent to said apparatus.

3. The unitary apparatus according to claim 1, further comprising means for removing organic solvent containing particulate matter from said lower vapor generating zone.

4. The unitary apparatus according to claim 1, wherein said substantially selective water-permeable membrane has a solution permeation coefficient of at least 0.01 kg/m² hr and a separation coefficient of at least 10, said separation coefficient defined by the formula $$\text{Separation Coefficient} = \frac{A/B}{C/D}$$

where
A = water concentration in the permeating liquid,
B = solvent concentration in the permeating liquid,
C = water concentration in the liquid fed to the liquid treating chamber, and
D = solvent concentration in the liquid fed to the liquid treating chamber.

5. The unitary apparatus according to claim 4, wherein said solution permeation coefficient is at least 0.05 kg/m² hr and said separation coefficient is at least 30.

6. The unitary apparatus according to claim 1, wherein said substantially selective water-permeable membrane is an ion-exchange membrane.

7. The unitary apparatus according to claim 1, wherein said demisting zone comprises at least one bubble cap tray, perforated plate tray or sieve tray.

8. The unitary apparatus according to claim 1, wherein said demisting zone comprises a packed column.

* * * * *